(12) United States Patent
Kuo

(10) Patent No.: US 10,143,077 B1
(45) Date of Patent: Nov. 27, 2018

(54) PRINTED CIRCUIT BOARD STRUCTURE

(71) Applicant: Quanta Computer Inc., Taoyuan (TW)

(72) Inventor: Chao-Hung Kuo, Taoyuan (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 0 days.

(21) Appl. No.: 16/003,238

(22) Filed: Jun. 8, 2018

(30) Foreign Application Priority Data

Dec. 12, 2017  (TW) .............................. 106143518 A

(51) Int. Cl.
*H05K 1/02* (2006.01)
*H05K 1/11* (2006.01)

(52) U.S. Cl.
CPC ............ *H05K 1/0224* (2013.01); *H05K 1/115* (2013.01); *H05K 2201/093* (2013.01); *H05K 2201/09327* (2013.01)

(58) Field of Classification Search
CPC ....... H05K 1/0224; H05K 2201/09327; H05K 2201/093; H05K 1/115
USPC .......................................................... 174/257
See application file for complete search history.

(56) References Cited

U.S. PATENT DOCUMENTS

| 8,436,785 | B1* | 5/2013 | Lai ..................... H01Q 15/0026 343/745 |
| 2003/0123238 | A1* | 7/2003 | Yu ......................... H05K 1/0218 361/780 |
| 2009/0231819 | A1* | 9/2009 | Satake ................. H05K 1/0224 361/762 |
| 2016/0134021 | A1* | 5/2016 | Helander ............. H01Q 9/0407 343/893 |

FOREIGN PATENT DOCUMENTS

TW              573459 B       1/2004

OTHER PUBLICATIONS

Chinese language office action dated Jun. 5, 2018, issued in application No. TW 106143518.

* cited by examiner

*Primary Examiner* — Sherman Ng
(74) *Attorney, Agent, or Firm* — McClure, Qualey & Rodack, LLP

(57) ABSTRACT

A PCB (Printed Circuit Board) structure at least includes a power layer. The power layer includes a first power shape and a plurality of ground elements. The first power shape is surrounded by the ground elements. The distance between any two adjacent ground elements is shorter than 0.1 wavelength of a predetermined frequency, so as to reduce electromagnetic noise radiation at the predetermined frequency.

10 Claims, 7 Drawing Sheets

US 10,143,077 B1

PRINTED CIRCUIT BOARD STRUCTURE

CROSS REFERENCE TO RELATED APPLICATIONS

This Application claims priority of Taiwan Patent Application No. 106143518 filed on Dec. 12, 2017, the entirety of which is incorporated by reference herein.

BACKGROUND OF THE INVENTION

Field of the Invention

The disclosure generally relates to a PCB (Printed Circuit Board) structure, and more particularly, it relates to a PCB structure for reducing electromagnetic noise radiation.

Description of the Related Art

Current electronic products usually support the function of wireless communication. For example, a high-frequency circuit board in an electronic product can carry some wireless communication elements, such as a Wi-Fi module, a Bluetooth module, and an LTE (Long Term Evolution) module. However, a power layer on the high-frequency circuit board tends to generate electromagnetic noise due to the high-speed switching operation of a variety of circuit elements. It will seriously affect the functioning of the wireless communication by the electronic product.

Accordingly, there is a need to propose a novel solution for solving the problem of the prior art.

BRIEF SUMMARY OF THE INVENTION

In an exemplary embodiment, the disclosure is directed to a PCB (Printed Circuit Board) structure including a power layer. The power layer includes a first power shape and a plurality of ground elements. The first power shape is surrounded by the ground elements. A distance between any adjacent two of the ground elements is shorter than 0.1 wavelength of a predetermined frequency, so as to reduce electromagnetic noise radiation at the predetermined frequency.

In some embodiments, the PCB structure is a multilayer PCB.

In some embodiments, the ground elements are metal pieces or metal lines.

In some embodiments, a parasitic capacitance is formed between the first power shape and each of the ground elements, such that electric lines of force of the electromagnetic noise radiation begin from the first power shape, extend through the parasitic capacitances, and finally reach the ground elements.

In some embodiments, the PCB structure further includes a first ground layer and a second ground layer. The power layer is positioned between the first ground layer and the second ground layer.

In some embodiments, the PCB structure further includes a plurality of conductive via elements. The ground elements are coupled through the conductive via elements to at least one of the first ground layer and the second ground layer.

In some embodiments, an interlayer capacitance is formed between the first power shape and each of the first ground layer and the second ground layer, such that electric lines of force of the electromagnetic noise radiation begin from the first power shape, extend through the interlayer capacitances, and finally reach the first ground layer or the second ground layer.

In some embodiments, the power layer further includes a second power shape.

In some embodiments, the first power shape and the second power shape have different supply voltages.

In some embodiments, the second power shape is surrounded by the ground elements.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
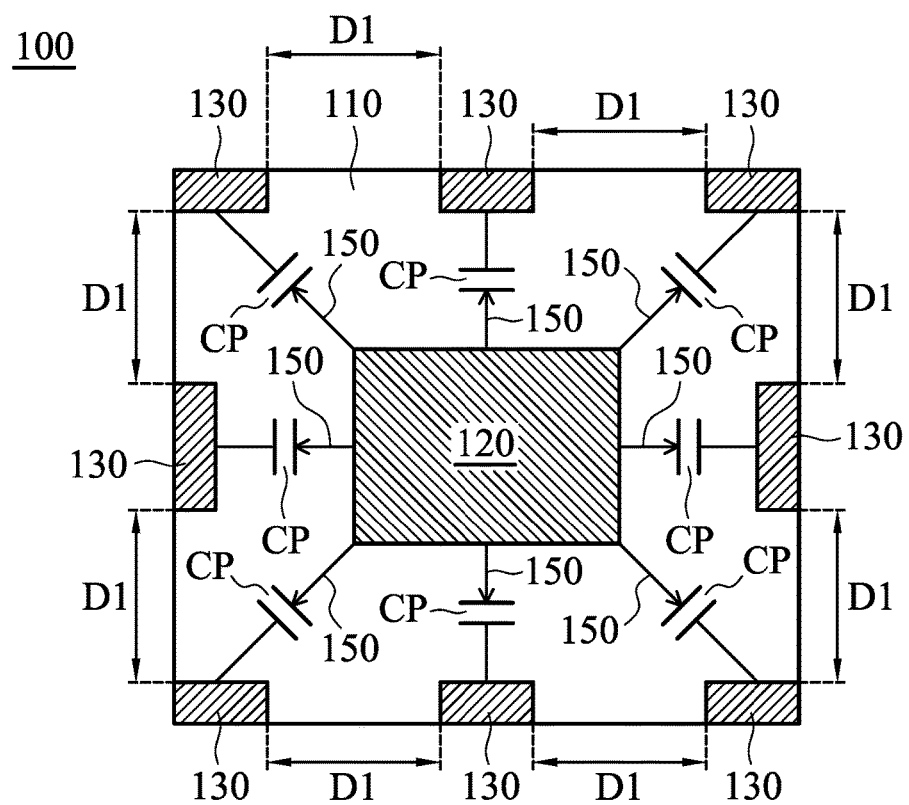
FIG. 1 is a top view of a PCB (Printed Circuit Board) structure according to an embodiment of the invention.

FIG. 1 is a top view of a PCB (Printed Circuit Board) structure 100 according to an embodiment of the invention. For example, the PCB structure 100 may be a multilayer PCB. As shown in FIG. 1, the PCB structure 100 at least includes a power layer 110. The power layer 110 includes a first power shape 120 and a plurality of ground elements 130. The first power shape 120 is substantially surrounded by the ground elements 130. The shapes, types, and total number of the first power shape 120 and the ground elements 130 are not limited in the invention. The first power shape 120 may be a metal plane, which may be coupled to a supply voltage, such as 1.8V, 3V, or 5V. The ground elements 130 may be metal pieces or metal lines, which may be coupled to a ground voltage, such as 0V. The ground elements 130 and the first power shape 110 may be disposed on the same plane. The ground elements 130 and the first power shape 110 may be completely separate from each other. In some embodiments, the power layer 110 further includes a dielectric substrate, such as an FR4 (Flame Retardant 4) substrate, for carrying the first power shape 120 and the ground elements 130. The dielectric substrate may substantially have a rectangular shape or an irregular shape corresponding to the different shapes of the first power shape 120 and the ground elements 130.

The power layer 110 of the PCB structure 100 is configured to provide different supply voltages to a variety of wireless communication elements. However, each power shape (e.g., the first power shape 120) of the power layer 110 tends to generate electromagnetic noise radiation due to the high-speed switching operation of the wireless communication elements, thereby degrading the whole communication quality. Accordingly, in the preferred embodiment of the invention, a plurality of ground elements 130 are configured to surround the first power shape 110. The distance D1 between any two (or every two) adjacent ground elements 130 is shorter than 0.1 wavelength ($\lambda/10$) of a predetermined frequency. The aforementioned distances D1 may be the same length or different lengths. According to the practical measurement, if each of the aforementioned distances D1 is shorter than 0.1 wavelength ($\lambda/10$) of the predetermined frequency, any two adjacent ground elements 130 will generate an almost perfect Faraday cage at the predetermined frequency. Such a design can avoid leakage of electromagnetic noise and reduce electromagnetic noise radiation at the predetermined frequency.

It should be understood that the electromagnetic noise radiation includes electric lines of force and lines of magnetic fields, which are perpendicular to each other. The following embodiments will introduce only the distribution of the electric lines of force to illustrate the performance of the invention (the lines of magnetic fields are hidden to simplify the figures). The electromagnetic noise radiation is generated by the first power shape 120, and its transmission is modeled as a plurality of electric lines 150 of force. Specifically, a parasitic capacitance CP is formed between the first power shape 120 and each of the ground elements 130, such that the electric lines 150 of force of the electromagnetic noise radiation begin from the first power shape 120, extend through the parasitic capacitances CP, and finally reach the ground elements 130. Accordingly, the proposed design can limit the electromagnetic noise radiation between the first power shape 120 and the ground elements 130, so as to prevent the electromagnetic noise radiation from leaking outwardly and negatively affecting other wireless communication elements.

Figure 2:
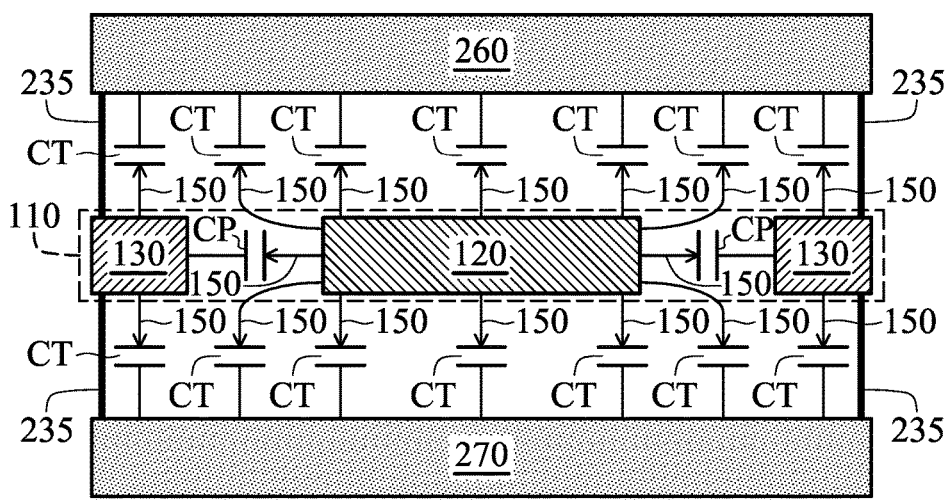
FIG. 2 is a sectional view of a PCB structure according to an embodiment of the invention.

FIG. 2 is a sectional view of a PCB structure 200 according to an embodiment of the invention. FIG. 2 is similar to FIG. 1. In the embodiment of FIG. 2, the PCB structure 200 further includes a first ground layer 260 and a second ground layer 270. The first ground layer 260 and the second ground layer 270 may be the largest ground metal planes of the PCB structure 200. The first ground layer 260 and the second ground layer 270 may be coupled to a ground voltage. The aforementioned power layer 110 may be positioned between the first ground layer 260 and the second ground layer 270. The first ground layer 260, the power layer 110, and the second ground layer 270 may be substantially parallel to each other. In some embodiments, the PCB structure 200 further includes a plurality of conductive via elements 235. The ground elements 130 of the power layer 110 are coupled through the conductive via elements 235 to the first ground layer 260, the second ground layer 270, or both of them, such that the ground elements 130 can share the same ground voltage with the first ground layer 260 and the second ground layer 270.

As mentioned above, the electromagnetic noise radiation is generated by the first power shape 120, and its transmission is modeled as a plurality of electric lines 150 of force. Specifically, an interlayer capacitance CT is formed between the first power shape 120 and each of the first ground layer 260 and the second ground layer 270, such that the electric lines 150 of force of the electromagnetic noise radiation begin from the first power shape 120, extend through the interlayer capacitances CT, and finally reach the first ground layer 260 or the second ground layer 270. The interlayer capacitance CT may also be formed between the first ground layer 260 or the second ground layer 270 and a corresponding one of the ground elements 130, so as to guide the electric lines 150 of force finally to the first ground layer 260 or the second ground layer 270. Generally, the incorporation of the ground elements 130 can prevent the electromagnetic noise radiation from leaking in horizontal directions (e.g., XY plane), and the incorporation of the first ground layer 260 and the second ground layer 270 can prevent the electromagnetic noise radiation from leaking in vertical directions (e.g., +Z axis and −Z axis). Accordingly, the SNR (Signal-to-Noise Ratio) of the PCB structure 200 can be significantly increased. In alternative embodiments, the first ground layer 260 and the second ground layer 270 can be replaced with different-type metal layers, such as signal layers, but they are not limited thereto.

Figure 3:
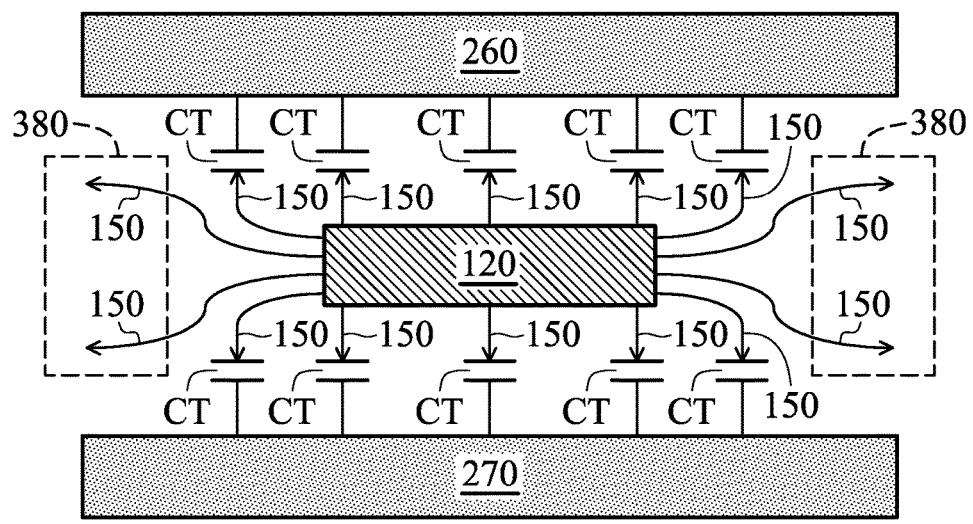
FIG. 3 is a sectional view of a PCB structure without any ground element.
Figure 3:
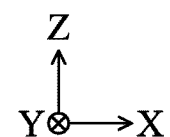

FIG. 3 is a sectional view of the PCB structure 200 without any ground element 130. As shown in FIG. 3, if the ground elements 130 are all removed from the PCB structure 200, the electric lines 150 of force of electromagnetic noise radiation will partially leak at lateral sides (indicated by a dotted box 380), thereby increasing the electromagnetic noise radiation in horizontal directions (e.g., XY plane). By comparing FIG. 2 with FIG. 3, the ground elements 130 of the invention can effectively suppress the electromagnetic noise radiation at lateral sides or in horizontal directions, and they have a similar function to that of each adjacent ground layer.

Figure 4:
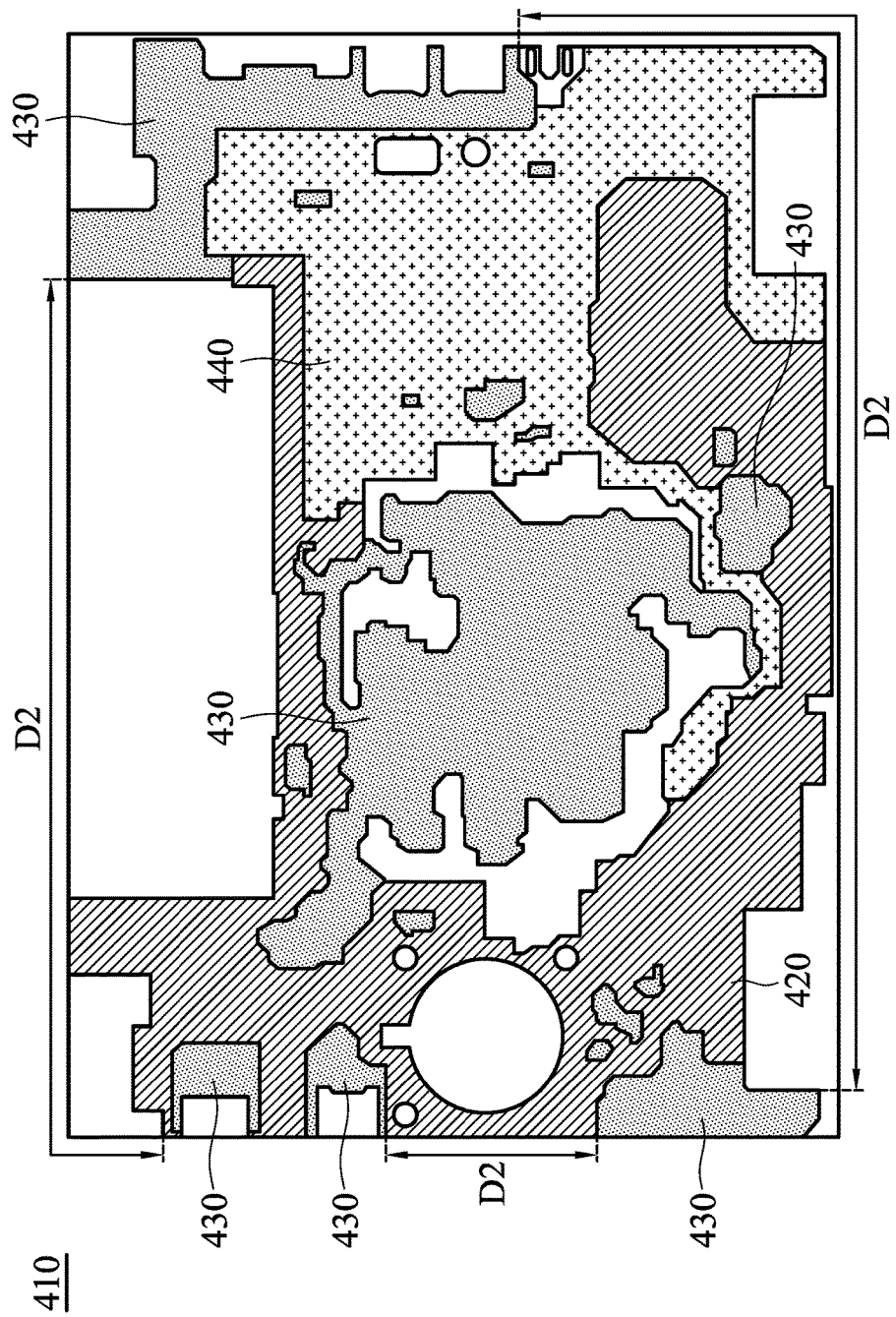
FIG. 4 is a diagram of a circuit layout of a power layer according to an embodiment of the invention.

FIG. 4 is a diagram of a circuit layout of a power layer 410 according to an embodiment of the invention. In the embodiment of FIG. 4, the power layer 410 includes a first power shape 420, a second power shape 440, and a plurality of ground elements 430. The first power shape 420 and the second power shape 440 may be different metal planes, which may be coupled to different supply voltages. For example, the first power shape 420 may have a 3V supply voltage, and the second power shape 440 may have another 5V supply voltage, but they are not limited thereto. As shown in FIG. 4, the ground elements 430 do not completely surround the first power shape 420 and the second power shape 440. That is, the distance D2 between any two adjacent ground elements 430 may be much longer than 0.1 wavelength ($\lambda/10$) of the frequency of electromagnetic noise radiation.

Figure 5:
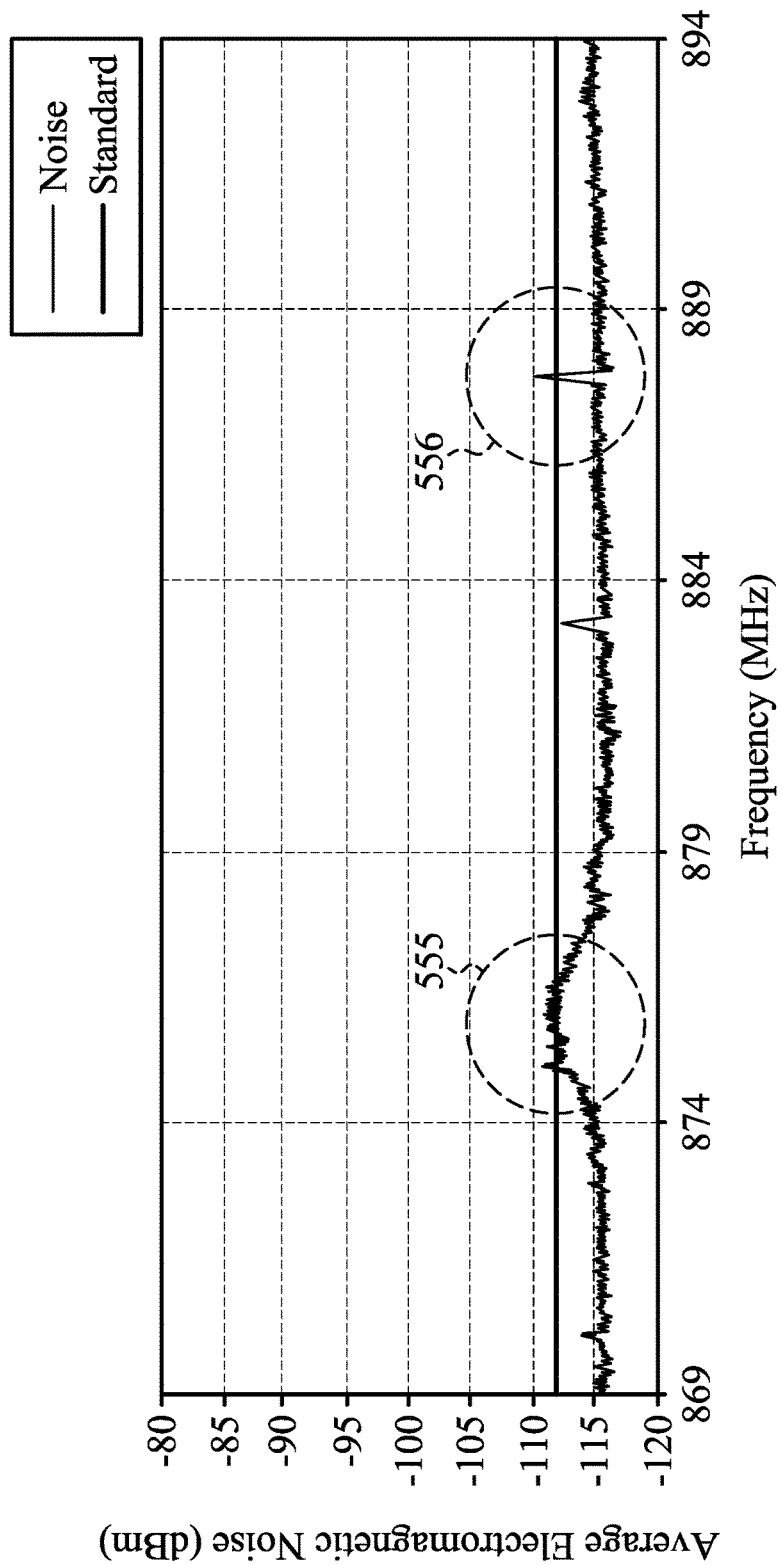
FIG. 5 is a diagram of average electromagnetic noise of a power layer according to an embodiment of the invention.

FIG. 5 is a diagram of average electromagnetic noise of the power layer 410 according to an embodiment of the invention. The horizontal axis represents operation frequency (MHz), and the vertical axis represents average electromagnetic noise (dBm). As shown in FIG. 5, if the distances D2 relative to the ground elements 430 are not appropriately designed, a maximum value 555 of electromagnetic noise radiation will be measured around the power layer 410 within a frequency interval from 874 MHz to 879 MHz, and another maximum value 556 of electromagnetic noise radiation will be measured around the power layer 410 within another frequency interval from 873 MHz to 887 MHz. The maximum values 555 and 556 are both higher than the standard (e.g., about −112 dBm).

Figure 6:
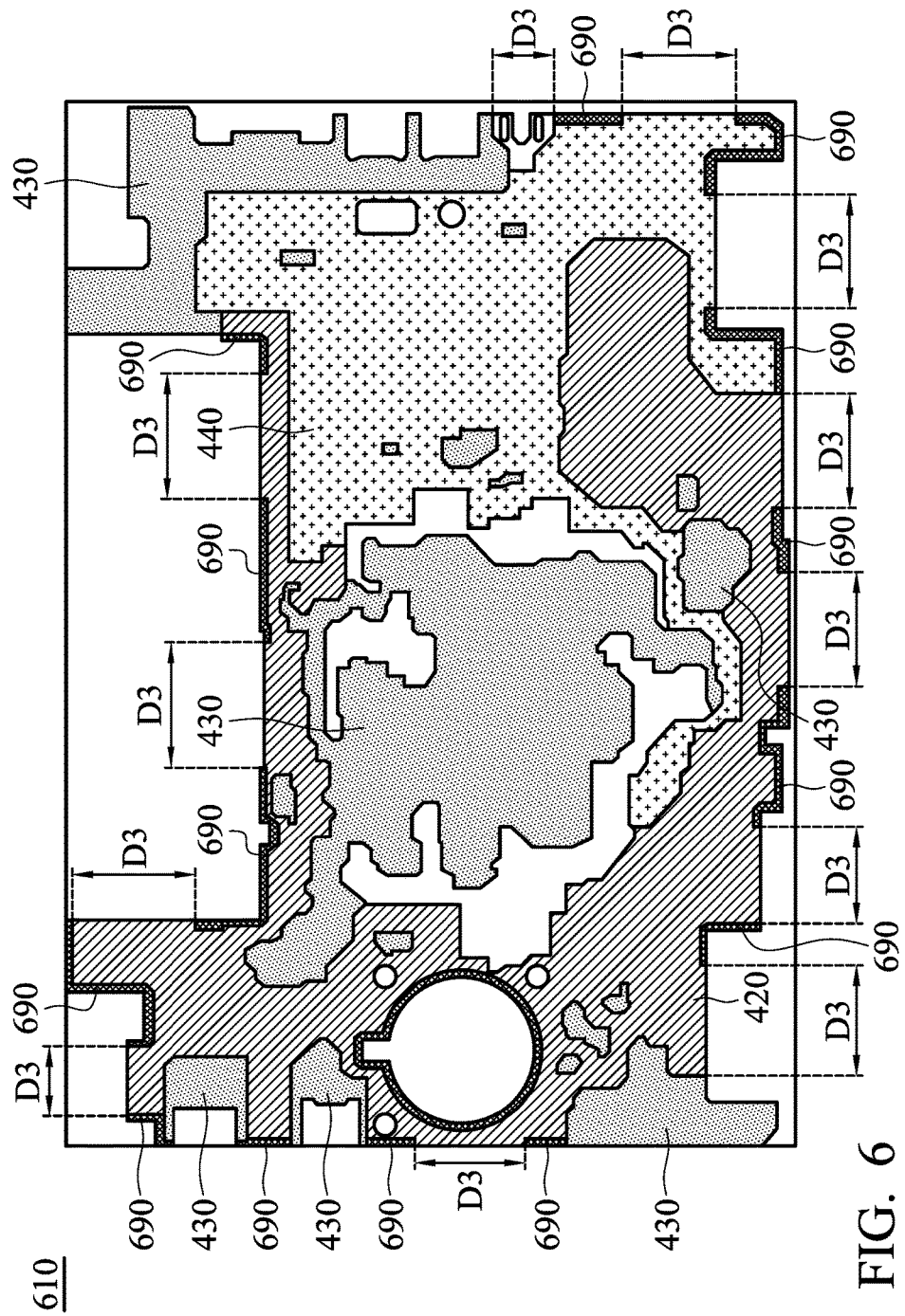
FIG. 6 is a diagram of a circuit layout of a power layer according to another embodiment of the invention.

FIG. 6 is a diagram of a circuit layout of a power layer 610 according to another embodiment of the invention. FIG. 6 is similar to FIG. 4. The power layer 610 of FIG. 6 is considered as an improved configuration of the power layer 410 of FIG. 4. In the embodiment of FIG. 6, the power layer 610 additionally includes a plurality of ground elements 690. The first power shape 420 and the second power shape 440 are substantially surrounded by the ground elements 430 and 690. For example, the ground elements 690 may be metal lines. These metal lines may have different lengths but the same width of about 40 mil. Specifically, any one of the ground elements 690 may substantially have a straight-line shape, an L-shape, a meandering shape, a U-shape, or an S-shape. The lengths, widths, and shapes of the ground elements 690 are adjustable according to different requirements. After the ground elements 690 are added, the distance D3 between any two (or every two) adjacent ground elements 430 and 690 is shorter than 0.1 wavelength ($\lambda/10$) of a predetermined frequency, so as to reduce the electromagnetic noise radiation at the predetermined frequency. For example, if the highest operation frequency of the power layer 610 is 894.2 MHz, the predetermined frequency relative to the electromagnetic noise radiation may be defined as 894.2 MHz, which corresponds to the shortest 0.1 wavelength (about 3.356 cm). That is, the distance D3 between any two (or every two) adjacent ground elements 430 and 690 may be shorter than 3.356 cm. The above ranges of frequency, wavelengths, and distances may be adjustable according to different requirements.

Figure 7:
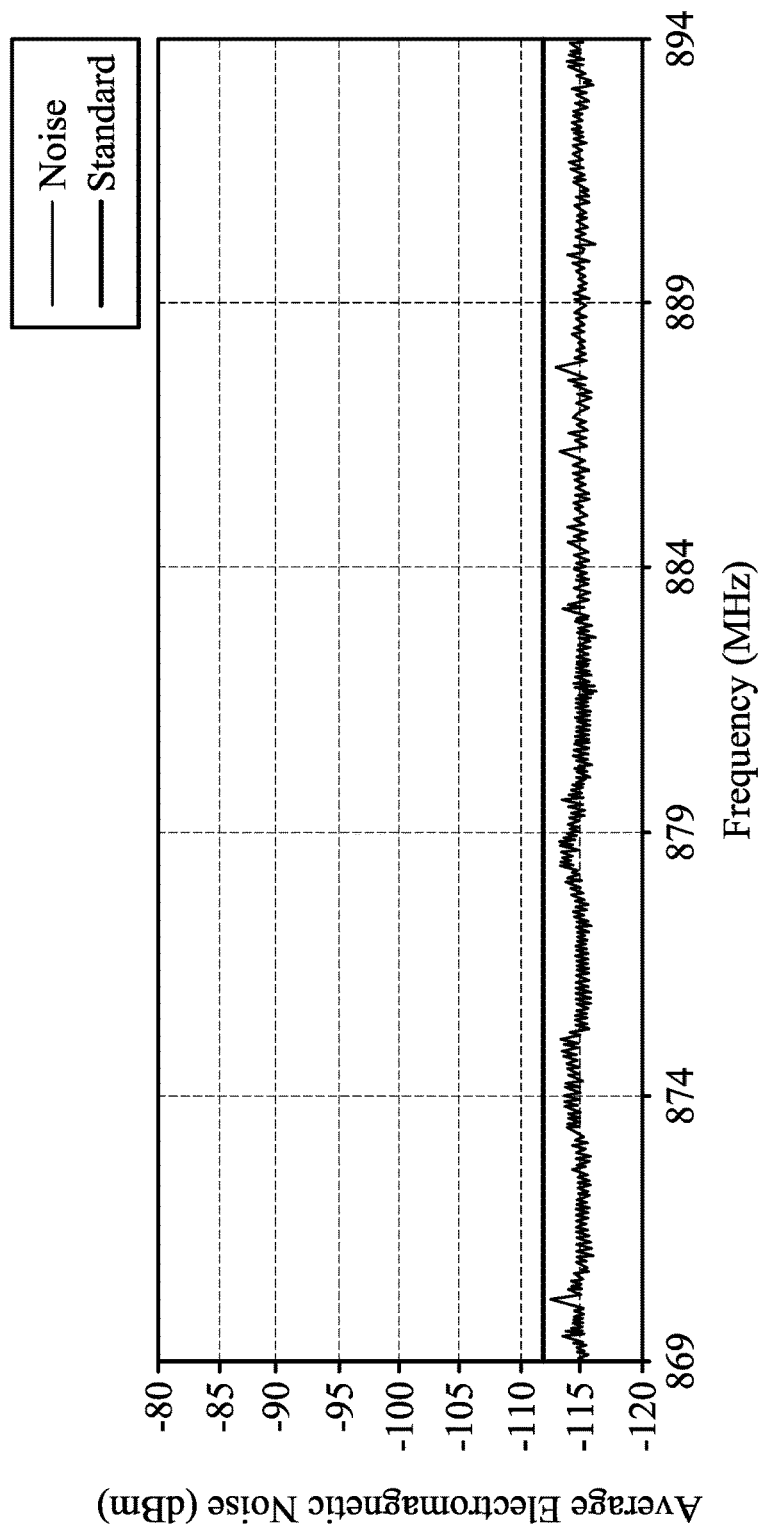
FIG. 7 is a diagram of average electromagnetic noise of a power layer according to another embodiment of the invention.

FIG. 7 is a diagram of average electromagnetic noise of the power layer 610 according to another embodiment of the invention. The horizontal axis represents operation frequency (MHz), and the vertical axis represents average electromagnetic noise (dBm). As shown in FIG. 7, if the distances D3 relative to the ground elements 430 and 690 are appropriately designed, all maximum values of electromagnetic noise radiation around the power layer 610 within a frequency interval from 869 MHz to 894 MHz will be lower than the standard. By comparing the measurement of FIG. 5 with that of FIG. 7, the incorporation of the ground elements 690 of the invention reduces the maximum values 555 and 556 of electromagnetic noise radiation by at least 5 dB, and it significantly suppresses noise radiation.

The invention proposes a novel PCB structure. By adding ground elements and appropriately designing the distances therebetween, the invention can effectively prevent electromagnetic noise radiation of a power layer from leaking and interfering with other wireless communication elements. It should be noted that the invention has at least the advantages of low cost and high improvement. Therefore, the proposed design is suitable for application in a variety of wireless communication devices with high sensitivity.

Note that the above element sizes, element shapes, and frequency ranges are not limitations of the invention. A designer can fine-tune these settings or values according to different requirements. It should be understood that the PCB structure of the invention is not limited to the configurations of FIGS. 1-7. The invention may merely include any one or more features of any one or more embodiments of FIGS. 1-7. In other words, not all of the features displayed in the figures should be implemented in the PCB structure.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A PCB (Printed Circuit Board) structure, comprising:
   a power layer, comprising a first power shape and a plurality of ground elements, wherein the first power shape is surrounded by the ground elements;
   wherein a distance between any adjacent two of the ground elements is shorter than 0.1 wavelength of a predetermined frequency, so as to reduce electromagnetic noise radiation at the predetermined frequency.

2. The PCB structure as claimed in claim 1, wherein the PCB structure is a multilayer PCB.

3. The PCB structure as claimed in claim 1, wherein the ground elements are metal pieces or metal lines.

4. The PCB structure as claimed in claim 1, wherein a parasitic capacitance is formed between the first power shape and each of the ground elements, such that electric lines of force of the electromagnetic noise radiation begin from the first power shape, extend through the parasitic capacitances, and finally reach the ground elements.

5. The PCB structure as claimed in claim 1, further comprising:
   a first ground layer; and
   a second ground layer, wherein the power layer is positioned between the first ground layer and the second ground layer.

6. The PCB structure as claimed in claim 5, further comprising:
   a plurality of conductive via elements, wherein the ground elements are coupled through the conductive via elements to at least one of the first ground layer and the second ground layer.

7. The PCB structure as claimed in claim 5, wherein an interlayer capacitance is formed between the first power shape and each of the first ground layer and the second ground layer, such that electric lines of force of the electromagnetic noise radiation begin from the first power shape, extend through the interlayer capacitances, and finally reach the first ground layer or the second ground layer.

8. The PCB structure as claimed in claim 1, wherein the power layer further comprises a second power shape.

9. The PCB structure as claimed in claim 8, wherein the first power shape and the second power shape have different supply voltages.

10. The PCB structure as claimed in claim 8, wherein the second power shape is surrounded by the ground elements.

* * * * *